United States Patent [19]

Woodbrey et al.

[11] 4,234,674

[45] Nov. 18, 1980

[54] AMINO-FUNCTIONAL PHOTOPOLYMER COMPOSITIONS AND PHOTO-OXIDATION IMAGING PROCESSES EMPLOYING SAME

[75] Inventors: James C. Woodbrey, Chesterfield, Mo.; Marlowe V. Moncur, Pensacola, Fla.

[73] Assignee: Monsanto Company, St. Louis, Mo.

[21] Appl. No.: 64,978

[22] Filed: Aug. 8, 1979

Related U.S. Application Data

[62] Division of Ser. No. 866,133, Dec. 30, 1977, Pat. No. 4,188,223.

[51] Int. Cl.³ .................. G03C 11/12; G03C 5/00; G03C 1/68
[52] U.S. Cl. .................. 430/253; 204/159.22; 204/159.23; 430/270; 430/286; 430/291; 430/325; 430/367; 430/913; 430/283
[58] Field of Search ............. 430/270, 286, 283, 913, 430/291, 325, 367, 253; 204/159.14, 159.22, 159.23

[56] References Cited

U.S. PATENT DOCUMENTS

| | | | |
|---|---|---|---|
| 3,512,971 | 5/1970 | Floss et al. | 430/306 |
| 3,790,389 | 2/1974 | Heimsch et al. | 430/286 |
| 3,801,320 | 4/1974 | Erickson | 430/353 |
| 3,832,188 | 8/1974 | Bamba et al. | 430/283 |
| 3,856,523 | 12/1974 | Ulrich | 430/302 |
| 3,864,133 | 2/1975 | Nisamatsu | 430/284 |
| 4,085,019 | 4/1978 | Green | 204/159.23 |

*Primary Examiner*—Edward C. Kimlin
*Attorney, Agent, or Firm*—Sughrue, Rothwell, Mion, Zinn and Macpeak

[57] ABSTRACT

The present invention relates to amino-functional photopolymer compositions and to photo-oxidation imaging processes utilizing such compositions. The amino-functional photopolymer compositions comprise amino-functional polymers. For example, other polymers or resins without amino-functionality may be incorporated to aid in adapting the compositions for use in particular applications as are discussed herein.

19 Claims, No Drawings

AMINO-FUNCTIONAL PHOTOPOLYMER COMPOSITIONS AND PHOTO-OXIDATION IMAGING PROCESSES EMPLOYING SAME

This is a Division of application Ser. No. 866,133, filed Dec. 30, 1977, now U.S. Pat. No. 4,188,223.

BACKGROUND OF THE INVENTION

1. Field of the Invention

The invention relates to amino-functional photopolymer compositions containing photosensitizers which upon irradiation in the presence of ordinary molecular oxygen become cured. By selective irradiation, the photopolymer compositions lend themselves to use in photo-oxidation imaging processes which are also within the scope of the invention.

2. Description of the Prior Art

The prior art is replete with disclosures of photopolymers which are curable, cross-linkable or photopolymerizable upon exposure to irradiation. A variety of catalytic free-radical mechanisms have been postulated to explain the chemistries of many of these photopolymerization processes. Such photo-initiated, free-radical, photopolymerization, imaging processes generally are inhibited by the presence of molecular oxygen in contrast to the photo-oxidation imaging process of the present invention, where the presence of molecular oxygen is a requisite.

There have also been prior teachings of photopolymerizable systems in which the photopolymer may contain an amine moiety.

U.S. Pat. No. 3,914,165, Gaske, relates to a photopolymer system based on Michael addition reaction products. An amine containing at least one amino hydrogen atom is adducted with an excess of ethylenic material comprising a polyacrylate to form an adduct containing unreacted acrylate groups and at least one tertiary beta amino group. The radiation cure realized with the Gaske photopolymer is not based primarily on amino-functionality, but relies on an excess of unreacted ethylenic unsaturation which enables subsequent photopolymerization under the influence of well-known photo-initiators and ultraviolet radiation. Thus, the Gaske disclosure does not teach a photopolymer system wherein photo-oxidation of amino-functionality is relied upon to effect the cure or other physical change in the photopolymer.

U.S. Pat. No. 3,533,796, Lassig, discloses a light-sensitive material comprising a polymer which contains N-methylol ester units or N-methylol ether units of acrylamide or methacrylamide in combination with a compound capable of giving off hydrogen ions under the influence of light. The polymers cross-link by acid hydrolysis of the ether or ester groups to form methylol groups which immediately give rise to inter-molecular condensation.

Two U.S. Pat. Nos. 3,876,518 and 3,878,077, both issued to Borden, et al., relate to acrylated epoxidized soybean oil amine compounds. According to the patents, an epoxidized soybean oil is acrylated and subsequently reacted with an amine compound. The resulting amine derivative is photo-curable with high-energy ionizing radiation or, when acylyl or methacrylyl groups are present, with well-known photo-initiators and ultraviolet radiation.

U.S. Pat. No. 3,697,274, Herrmanns, discloses an acid-curable amine-formaldehyde resin. Coatings of this resin are photo-curable only when they contain a light-sensitive halogen compound.

U.S. Pat. No. 3,512,971, Floss, et al., discloses a photo-curable composition based on a mixture of polyamides with photopolymerizable bis-acrylamide and well-known photoinitiators.

The prior art does not disclose a photopolymer system which relies primarily on the presence of amino groups to cross-link or otherwise physically change or photo-cure the photopolymer composition. To the extent that the prior art describes some form of amino-functionality in photopolymer compositions, the disclosures are limited to photo-curing mechanisms which rely on the presence of other active ingredients or functionality in order to effect photo-cross-linking or photo-curing of the polymer system. In any event, the prior art does not describe photo-oxidation curing or photo-oxidation imaging of amino-functional polymers.

Photo-oxidation processes for imaging polymer films have been described in a number of issued U.S. patents—e.g., No. 3,790,389, Heimsch, et al., No. 3,801,320, Erickson, No. 3,847,609 and No. 3,926,648, both of Breslow, et al., and No. 3,846,266, Duinstee, et al. The processes disclosed in the foregoing patents achieve photoimaging by the photo-oxidation of —C=C— unsaturation in polymer films by exposure in the presence of oxygen and a photosensitizer. The photo-oxidation results in the production of hydroperoxides attached to the polymer chain at the site of the allylic unsaturation. The latent hydroperoxide polymer image may then be amplified and/or developed by a variety of techniques. Polymers containing sulfur-functionality which can be imaged by photo-oxidation processes are also described in pending U.S. patent application Ser. No. 756,034, Kern.

The present invention does not depend for imaging upon the hydroperoxidation of —C=C— unsaturation or on the oxidation of sulfur-functionality, but on available amino-functionality. The copresence of carbon-to-carbon unsaturation and/or sulfur-functionality in the amino-functional photopolymer or in other polymers present in the composition is not excluded from the present invention and, in some instances, may be beneficial, but it should be understood that the invention does not depend on the presence of carbon-to-carbon unsaturation or sulfur-functionality.

SUMMARY OF THE INVENTION

The present invention is directed to amino-functional photopolymer compositions and their use in photoimaging and photo-curing processes. The compositions consist essentially of an admixture or solution of at least one amino-functional polymer and a photosensitizer admixed with, or exposed to, ordinary molecular oxygen. The amino-functional polymer must be one which is capable of being cured upon irradiation in the presence of the photosensitizer and molecular oxygen. The photo-curing process utilizes the compositions of the invention and comprises exposing the compositions to appropriate amounts of irradiation such that the desired property change of the photopolymer composition is realized. The photo-curing may be utilized in photoimaging by selectively exposing the photopolymer composition and then developing the desired image by reliance upon property differentials between the exposed and unexposed portions of the composition.

DETAILED DESCRIPTION OF THE INVENTION

The compositions of the invention comprise mixtures of amino-functional photopolymers and photosensitizers which, in order to be operative upon exposure to irradiation, must contain or be exposed to ordinary molecular oxygen.

As briefly described above, the amino-functional photopolymer may be selected from a wide variety of amino-functional polymers which contain two or more amino-functional groups per polymeric molecule. Linear or branched soluble polymers may be utilized. Also satisfactory are small-particle-size microgel cross-linked polymers or mixtures of such microgel polymers with soluble polymers.

In general, the amino-functionality in the preferred photopolymers of this invention is derived from tertiary alkyl amines, hindered secondary aliphatic amines and dialkyl aryl amines.

Useful soluble branched or small-particle-size microgel cross-linked amino-functional glassy photopolymers may be prepared, for example, by the free-radical emulsion copolymerization of styrene with dialkylaminoalkyl methacrylate esters (for example, dimethylaminoethyl methacrylate), trimethylolpropane trimethacrylate as a branching and/or cross-linking comonomer and, if desired, bromoform as a chain-transfer agent. The same general types of soluble branched photopolymers may also be prepared, for example, by free-radical mass, suspension or solution copolymerizations. Soluble linear amino-functional glassy photopolymers may be prepared, for example, by free-radical mass, suspension, emulsion or solution copolymerizations of styrene with dialkylaminoalkyl methacrylate esters, with or without chain-transfer agents. Many other suitable glassy photopolymers may be prepared simply by replacing some or all of the styrene in the examples just described with other so-called "high-glass-temperature monomers or comonomers," such as, α-alkylstyrenes, aryl-substituted alkylstyrenes, vinylnaphthalenes, acenaphthalene, and/or methyl, ethyl, cyclohexyl, tert-butyl and/or benzyl methacrylates. Leathery or rubbery photopolymers may be prepared simply by replacing most or all of the styrene in the aforementioned examples with so-called "lower-glass-temperature monomers or comonomers," such as: alkyl acrylate esters; vinyl alkyl ethers; and/or 1,1-dialkylethylenes.

Examples of other useful added comonomers or alternate monomers for styrene in the aforementioned examples are: other alkyl methacrylate esters; glycidyl methacrylate; hydroxyalkyl methacrylate esters; glycidyl acrylate; hydroxyalkyl acrylate esters; acrylonitrile; methacrylonitrile; acrylamide; N-alkyl acrylamides; N-methylol acrylamide; N-benzyl acrylamide; N,N-dialkyl acrylamides; methacrylamide; ethylene; 1-alkenes; 1,3-butadiene; isoprene; vinyl carboxylate esters; maleic anhydride; allyl glycidyl ether; dialkylfumarate esters; dialkylmaleate esters; dialkyl itaconate esters; N-alkyl maleimides; N-vinylpyrrolidone; vinyl pyridines; N-vinyl carbazole; vinyl alkyl ketones; vinyl chloride; vinylidene chloride; vinylene carbonate; alkyl cinnamate esters; alkyl crotonate esters; crotanamide; and many other acrylic, vinyl and other types of unsaturated monomers.

Examples of other useful alternate amino-functional monomers or comonomers in the aforementioned examples are: vinylbenzyldialkyl amines; N-dialkylaminoalkyl acrylamides; N,N-bis(dialkylaminoalkyl) acrylamides; tert-butylaminoalkyl acrylate esters; N,N-dialkylisobutenylamines; allyldialkylamines; dialkylaminoalkyl vinyl ethers; and many other types of amino-functional unsaturated monomers.

Examples of other useful alternate branching and/or cross-linking monomers or comonomers are: trimethylolpropane dimethacrylate; trimethylolpropane di- and triacrylates; mono-, di-, tri-, tetra- and poly(ethyleneglycol dimethacrylates and diacrylates); mono-, di-, tri-, tetra- and poly(tetramethylene glycol dimethacrylates and diacrylates); pentaerythritol di-, tri- and tetramethacrylates and acrylates; divinylbenzenes, bis(vinylphenyl) butane; bis(vinylphenyl) ethane; bis(vinylphenyl) ether; bis(vinylphenyl) methane; bis(vinylphenyl) propane; bis(vinylphenyl) sulfide allyl acrylate and methacrylate; cinnamyl acrylate and methacrylate; cinnamoyloxyalkyl acrylate esters and methacrylate esters; crotyl acrylate and methacrylate; and many other difunctional and polyfunctional unsaturated compounds and polymers.

In a preferred embodiment of the invention, the compositions comprise as the photopolymer:

(a) one or more soluble branched or small-particle-size cross-linked copolymers of one or more monomers from the group:

α-methylstyrene; 2-methylstyrene; 4-methylstyrene; methyl methacrylate; ethyl methacrylate; propyl methacrylate; butyl methacrylate; 2-ethylhexyl methacrylate; cyclohexyl methacrylate; benzyl methacrylate; methyl acrylate ethyl acrylate; propyl acrylate; butyl acrylate; cyclohexyl acrylate; 2-ethylhexyl acrylate; benzyl acrylate; isoprene; and/or 1,3-butadiene;

(b) copolymerized with one or more monomers from the group:

ethylene glycol dimethacrylate; ethylene glycol diacrylate; propylene glycol dimethacrylate; propylene glycol diacrylate; tetramethylene glycol dimethacrylate; tetramethylene glycol diacrylate; diethylene glycol dimethacrylate; diethylene glycol diacrylate; dipropylene glycol dimethacrylate; dipropylene glycol diacrylate; ditetramethylene glycol dimethacrylate; ditetramethylene glycol diacrylate; poly(ethylene glycol dimethacrylate); poly(ethylene glycol diacrylate); poly(propylene glycol dimethacrylate); poly(propylene glycol diacrylate); poly(tetramethylene glycol dimethacrylate); poly(tetramethylene glycol diacrylate); trimethylolpropane dimethacrylate; trimethylolpropane diacrylate; trimethylolpropane trimethacrylate; trimethylolpropane triacrylate; pentaerythritol dimethacrylate; pentaerythritol diacrylate; pentaerythritol trimethacrylate; pentaerythritol triacrylate; pentaerythritol tetramethacrylate; pentaerythritol tetracrylate; bisphenol "A" dimethacrylate; bisphenol "A" diacrylate; divinylbenzene; bis(vinylphenyl) methane; bis(vinylphenyl) ethane; bis(vinylphenyl) propane; bis(vinylphenyl) butane; bis(vinylphenyl) ether; bis(vinylphenyl) sulfide; allyl methacrylate; allyl acrylate; crotyl methacrylate; crotyl acrylate; cinnamyl methacrylate; cinnamyl acrylate; cinnamoyloxyethyl methacrylate; cinnamoyloxyethyl acrylate; diallyl fumarate; allyl cinnamate; N-allyl acrylamide; and/or N,N-diallyl acrylamide; and (c) further copolymerized with one or more compounds from the group:

dimethylaminoethyl methacrylate; dimethylaminoethyl acrylate; diethylaminoethyl methacrylate; diethylaminoethyl acrylate; vinylbenzyldimethylamine; vinyl benzyldiethylamine; N-dimethylaminoethyl acrylamide; N-diethylaminoethyl acrylamide; N,N-bis(dimethylaminoethyl) acrylamide; N,N-bis(diethylaminoethyl) acrylamide; N,N-dimethylisobutenylamine; N,N-diethylisobutenylamine; allyldimethylamine; and/or allyldiethylamine.

In other preferred embodiments of the invention, the compositions comprise as the photopolymer:

(a) one or more soluble copolymers of one or more monomers from the group:

styrene; α-methylstyrene; 2-methylstyrene; 4-methylstyrene; methyl methacrylate; ethyl methacrylate; propyl methacrylate; butyl methacrylate; 2-ethylhexyl methacrylate; cyclohexyl methacrylate; benzyl methacrylate; ethyl acrylate; propyl acrylate; butyl acrylate; cyclohexyl acrylate; 2-ethylhexyl acrylate; benzyl acrylate; isoprene; and/or 1,3-butadiene; and (b) copolymerized with one or more monomers selected from the group:

dimethylaminoethyl methacrylate; dimethylaminoethyl acrylate; diethylaminoethyl methacrylate; diethylaminoethyl acrylate; vinylbenzyldimethylamine; vinylbenzyldiethylamine; N-diethylaminoethyl acrylamide; N-dimethylaminoethyl acrylamide; N,N-bis(dimethylaminoethyl) acrylamide; N,N-bis(diethylaminoethyl) acrylamide; N,N-dimethylisobutenylamine; N,N-diethylisobutenylamine; allyldimethylamine; and/or allyldiethylamine.

The soluble branched or small-particle-size cross-linked copolymers and soluble linear copolymers described above may be used in admixture.

The above copolymers may or may not contain residues derived from the copresence of saturated-hydrocarbon, unsaturated-hydrocarbon, halocarbon and/or thiol-functional chain-transfer agents employed during the copolymerization synthesis.

Molecular weights of the photopolymers as made in the aforementioned examples may be controlled at high, low or intermediate values by using any of a large number of alternate, well-known free-radical chain-transfer agents. Alternatives include materials which impart no activity in photo-oxidation imaging processes, such as numerous saturated hydrocarbon solvents, alcohols and halocarbons, and materials which can impart activity in photo-oxidation imaging processes, such as numerous mercaptans, alkyl thioglycolate esters, alkyl β- and α-thiocarboxylate esters, and certain unsaturated hydrocarbons.

Suitable amino-functional photopolymers also may be prepared in numerous other ways. Some examples are: (1) amination of epoxide-functional polymers and resins, such as copolymers of glycidyl methacrylate or acrylate with numerous other unsaturated monomers or comonomers, or epoxide polymers derived from epoxidation of unsaturated polymers, or epoxide polymers derived from condensations of bisphenols and epichlorohydrin; (2) Michael addition of primary of secondary amines to certain polymers with activated unsaturation; and (3) nucleophilic displacement of halogenated polymers with amines.

Any photosensitizer capable of stimulating the production of singlet-oxygen upon appropriate irradiation in the presence of ordinary molecular oxygen and which is compatible with the photopolymer composition may be utilized in the invention.

TPP and other sensitizers of the porphyrin-type are preferred. Fluoranthene, dinaphthalene thiophene, and rose bengal are also useful.

Since such a wide variety of singlet-oxygen-type photosensitizers are available in the art, it would be impossible for applicants to experiment with all of them to confirm operability. It is expected, however, that many from the following categories would be useful, and it would be a matter of routine and simple experimentation for a person skilled in the art to select additional satisfactory photosensitizers from the following groups:

1. The aromatic group meso-substituted porphin compounds. Among such aromatic-substituted porphins are the ms-tetraarylporphins (ms-meso). These compounds are those porphins in which aryl groups having from 6–24 carbon atoms are substituted on the bridging carbon atoms of the porphin ring structure which contains four pyrrol nuclei linked together in a circular pattern by four briding carbon atoms to form a great ring. Examples of aryl groups which may be substituted in the meso-position of these compounds are phenyl; chlorophenyl; dichlorophenyl; methylphenyl; N,N-dimethyl-aminophenyl; hydroxyphenyl; naphthyl; biphenyl; anthracyl; phenanthryl; etc. In addition to the aryl group substituents noted above, the aryl groups can also have any or a combination of such substituents—e.g., as alkyloxy (1–20 carbon atoms) substituents such as methoxy, ethoxy, isopropoxy, butoxy, hexyloxy, etc., as well as any other substituents which do not change the fundamental aromatic character of the groups. These porphin sensitizers, including the above-exemplified arylporphins, can have various other substituents, particularly at the beta and beta' positions of the pyrrole rings—e.g., such substituents as lower alkyl (1–20 carbon atoms) such as vinyl or allyl or alkanoic acid groups such as methylcarboxy or ethylcarboxy.

Examples of porphin compounds which are expected to be useful as photochemical sensitizers in practicing this invention are the arylporphins such as the tetraphenyltetrazoporphins and the complexes thereof, such as diamagnetic complexes—e.g., magnesium tetraphenyltetrazoporphin; tetraphenyl tetrazoporphin acetate; tetraphenyltetrazoporphin sulfate; zinc tetraphenyltetrazoporphin; and the meso-aryl porphins, including alpha-, beta-, gamma-, delta-naphthylporphin and the dimagnetic metal chelates thereof—e.g., tetraphenylporphin; tetrakis (2,4-dichlorophenyl)porphin; tetrakis(2-furyl)porphin; tetrakis(4-methoxyphenyl)porphin; tetrakis(4-methylphenyl)porphin; tetrakis(2-thienyl)porphin; tetraphenylporphin zinc complex; tetrakis(4-nitrophenyl)porphin; and tetrakis(4-dimethylaminophenyl)porphin zinc complex—the tetrabenzomonoazo- and tetrabenzodiazoporphins, the 1,2,3,4,5,6,7,8-octaphenylporphins and azoporphins, such as octaphenylporphyrazine, the tetrabenzoporphins—e.g., tetrabenzoporphin and the zinc complex of tetrabenzoporphin.

2. Other porphin types of photosensitizing materials include chlorophyll, such as chlorophyll alpha and chlorophyll beta, hemin, the tetrazoporphins, chlorophyllin salt derivatives such as the reaction product of an alkaline metal chlorophyllin salt and sodium bisulfite, hemato-porphin, mercury proto- and hemato-porphins, vitamin $B_{12}$ and its derivatives and tetrakis(1-naphthyl)-porphin.

3. Related porphin-type materials include the phthalocyanine and metal complexes of phthalocyanine, such as the zinc and magnesium complexes of phthalocyanine, as well as phthalocyanine derivatives such as the barium or calcium salts of the phthalocyanine sulfonic acid; acetylated phthalocyanine; alkoxy- and aryloxy-benzosubstituted phthalocyanines; 5,5,',5'',5'''-tetraamino-metalphthalocyanine-4,4,',4'',4'''-tetrasulfonic acid; magnesium tetra(4)-methylthio-phthalocyanine; arylthioethers of phthalocyanines; vinyl groups containing tetraazoporphins and polymers thereof; mercaptoamino phthalocyanine derivatives; and phthalocyanine.

4. Other photosensitizers include fluorescein-type dyes and light-absorber materials based on a triarylmethane nucleus. Such compounds are well known and include Crystal Violet, Malachite green, Eosin, Rose Bengal and the like.

By varying the photosensitizer used in the compositions, the amino-functional photopolymer composition in the presence of ordinary molecular oxygen may be made sensitive to photo-curing by ultraviolet or visible irradiation, including green light and red light.

Other components or constituents may also be introduced into the photopolymer composition. For example, other polymers or resins without amino-functionality may be incorporated to improve the properties of the composition for specific end-use applications. For example, other polymers or resins may be introduced into the composition to improve the quality of photosensitive layers coated from solutions or dispersions onto photographic film bases; the additional polymers may assist in the dispersion of pigments into photosensitive coatings, inks or paints. The polymer additives may also enable non-photo-cured regions of coatings to be subtractively developed by redissolution or redispersion with specific solvents, such as water, aqueous alkali, aqueous acid, etc.; polymer or resin additive components may provide for, or enhance, the binding of specific types of dyes to either unexposed photosensitive films or to developed images or photo-cured coatings derived from the new compositions. Other types of photo-oxidizable polymers and resins may be incorporated, such as unsaturated polymers or polymers containing sulfur-functionality. The compositions may also contain a variety of pigments and dyes. Solvents, plasticizers, dispersing liquid media, etc. may be incorporated as diluents to assist in coating, to add flexibility, to modify viscosity, and generally to customize the composition for its intended use.

The processes for photoimaging by the use of photo-oxidation imaging compositions of the present invention broadly comprise selective exposure or imaging followed by development.

The precise conditions of exposure will depend upon the particular photopolymer and photosensitizer and may be accomplished in any convenient fashion. For example, exposure may be carried out by passing light through transparent regions of another image and allowing the transmitted light to impinge on and photo-cure a layer or body of photopolymer composition in accordance with the invention. Such exposures may be done by the so-called "contact" or "projection" procedures. Alternatively, exposure may be conducted by electronically-controlled imaging processes, such as those utilizing laser-scanners and information obtained from light transmitted through transparent regions of another image or light reflected from reflective regions of another image.

The second stage of the process, development and/or image enhancement, may be conducted as a single step or by a combination of several substeps. For example, development may be carried out by simply placing the imaged photopolymer in a fluid which removes the unexposed or uncured regions of the photopolymer from a base or substrate upon which the photopolymer composition was applied. The developing fluid redissolves or redisperses the uncured photopolymer and the other components of the photosensitive coating, but leaves the cured material in place. Development of the kind just described can be followed by other steps, such as post-dyeing or dye-enhancement of the resulting imaged layer, transfer of the resulting image layer from one substrate to another, or by etching, dissolution or dispersion of a resulting substratum. Development may also be accomplished by dusting or toning the imaged photopolymer where, for example, the unexposed regions of the imaged layer may be tacky and pigment-receptive or toner-receptive, whereas the exposed regions may be non-tacky and non-receptive to pigments and toners. Development may also be conducted by transferring pigmented or dyed polymer films or metal films to the more tacky, unexposed regions of an imaged layer containing little or no die or pigment. The development step may also consist of simple transfer of the more tacky, unexposed regions of an image layer to a new substrate. Transfer procedures such as those mentioned above may or may not require heat and/or high applied pressures.

The resulting imaged photopolymer, after development, may then be used for further imaging procedures, such as projecting the resultant image onto a surface or to expose a photosensitive surface.

In addition to using the photopolymer compositions of the present invention in photo-oxidation imaging processes, the materials also will be useful for producing cured films or coatings on a variety of substrates. Additionally, the compositions can be utilized as interlayers in laminates. In such an application, for example, the photopolymer composition could be introduced between layers of other film-forming material with sufficient entrapped or permeated air to provide the necessary oxygen for photo-oxidation. The assembly would then be exposed to the appropriate amount of radiation to photo-cure and bond the layers.

End products utilizing the photopolymer compositions of the present invention will include, by way of example, photographic films, plates, resists, coatings, or other photographic surface elements; photosensitive films, plates, resists, or coatings for use with laser-scanner and related types of imaging processes; photosensitive printing plates and cylinders; photo-curable paints, inks, adhesives and related surface coatings and interlayers.

As these examples imply, the new photo-oxidation imaging and photo-curing systems may take on the form of a thin film, coating or layer on or between essentially inert surfaces, such as a dimensionally stable plastic film base, paper, glass, metal, etc., or they may take on the form of liquid or paste-like compositions, such as paints, inks or other surface coatings which, during use are spread into relatively thin surface layers or interlayers and exposed to air. In all their forms, the new systems ultimately are relatively thin films, coatings, interlayers, etc. which are cured by exposure to electromagnetic radiation in the presence of ordinary molecular oxygen.

The present invention will be more fully appreciated by reference to the following working examples.

EXAMPLE 1

An amine-functional glassy, small-particle-size microgel cross-linked polymer was prepared by emulsion polymerization of styrene (75 parts), dimethylaminoethyl methacrylate (25), trimethylolpropane trimethacrylate (4.7) and bromoform (1.0). The resulting latex was coagulated and the isolated polymer dried. A casting dispersion was prepared from 8 parts of the polymer, 92 parts toluene, 0.04 parts tetraphenyl porphorin (TPP) and 6 parts of a pigment grind made from 30 parts magenta pigment (American Hoechst Perm Carmine FFB), 25 parts 20% polyisobutylene solution in toluene (Exxon-Vistanex L120), 0.2 parts Atlas G-3300 and 170 parts toluene. This dispersion was cast on polypropylene-coated polyester film base using a #8 wire-wound rod. After drying, the coated film was exposed for 80 seconds in a vacuum frame in contact with a standard halftone test negative (Berkey 2 Kw Addalux diazo source, 24 inches distant). A positive halftone image was developed by immersing and agitating the film in chloroform for 1–2 minutes.

EXAMPLE 2

Example 1 was repeated except the TPP was left out of the casting solution. No image was obtained (80 second exposure). If exposure was increased to 600 seconds, a very faint, highly underexposed image was visible. From this film, it was estimated that approximately 1200 second exposure would be required to set the image. This result demonstrates the requirement of the TPP singlet-oxygen photosensitizer in the photo-oxidation imaging process of Example 1.

EXAMPLE 3

A coated film was prepared as in Example 1. The film was conditioned in a nitrogen atmosphere in the dark for 2 hours. The film, still in a nitrogen atmosphere, was exposed with the Addalux source for 112 seconds. When developed with chloroform, the entire photopolymer coating was removed—i.e., no image was set. An identical film which was conditioned in air rather than nitrogen was exposed and developed in the same manner. None of the coating was removed during chloroform development in this case—i.e., an image was set. These results demonstrate the requirement of ordinary molecular oxygen in the photo-oxidation imaging process of Example 1.

EXAMPLE 4

Example 1 was repeated, except the dimethylaminoethyl methacrylate was replaced by additional styrene (25 parts) in the polymer synthesis. No image was obtained with an 80-second exposure, and only a very faint image was obtained for a 600-second exposure. This result demonstrates the requirement of the amino-functionality in the photopolymer in the photo-oxidation imaging process of Example 1.

EXAMPLE 5

Example 1 was repeated, except the bromoform chain-transfer agent was left out of the polymer synthesis. After the 80-second exposure, a halftone image was developed by immersing and agitating the film in chloroform for 1–2 minutes. This result demonstrates the unimportance of the bromoform chain-transfer agent in the photo-oxidation imaging process of Example 1.

EXAMPLE 6

Example 1 was repeated, except the photopolymer was prepared from methyl methacrylate (45 parts), butyl acrylate (45 parts), dimethylaminoethyl methacrylate (10 parts) and trimethylolpropane trimethacrylate (4.7 parts). After a 35-second exposure of the dried, coated film, prepared as in Example 1, and development in chloroform solvent, a halftone image was obtained. This result demonstrates the effectiveness of a leathery, small-particle-size microgel amino-functional polymer in the photo-oxidation imaging process.

EXAMPLE 7

Example 1 was repeated, except the dimethylaminoethyl methacrylate and bromoform chain-transfer agent were replaced by vinylbenzyldimethylamine (60% meta, 40% para) (25 parts) in the polymer synthesis. After a 150-second exposure, a halftone image was developed by immersion and agitating the film in chloroform for 1–2 minutes. This result demonstrates the photo-oxidation imaging process with another glassy small-particle-size microgel cross-linked amino-functional photopolymer.

EXAMPLE 8

Example 1 was repeated, except the styrene was replaced by methyl methacrylate in the photopolymer synthesis. After the 80-second exposure, a halftone image was developed by immersing and agitating the film in chloroform for 1–2 minutes. This result demonstrates the photo-oxidation imaging process with another glassy small-particle-size microgel cross-linked amino-functional photopolymer.

EXAMPLE 9

Example 1 may be repeated, except that the styrene and bromoform may be replaced by butyl acrylate (75 parts) in the photopolymer synthesis. After the 80-second exposure, a halftone image may be developed by immersing and agitating the film in chloroform for 1–2 minutes. This result would demonstrate the photo-oxidation imaging process with a rubbery small-particle-size microgel cross-linked amino-functional photopolymer.

EXAMPLE 10

Example 9 may be repeated, except that the dimethylaminoethyl methacrylate may be replaced by additional butylacrylate (25 parts) in the polymer synthesis. No image would be obtained with a 80-second exposure, and only a very faint image would be obtained for a 600-second exposure. This result would demonstrate the requirement of the amino-functionality in the rubbery microgel in the photo-oxidation imaging process of Example 9.

EXAMPLE 11

Example 1 was repeated, except the bromoform and trimethylolpropane trimethacrylate were left out of the photopolymer synthesis. The photopolymer was soluble in the casting solution. After a 60-second exposure of the coated film and development in chloroform solvent, a halftone image was obtained. This result demonstrates the photo-oxidation imaging process with a soluble, glassy amino-functional photopolymer.

EXAMPLE 12

Example 1 may be repeated, except that the styrene and trimethylolpropane trimethacrylate may be replaced by butyl acrylate (75 parts) in the polymer synthesis. The photopolymer would be soluble in the casting solution. After a 150-second exposure of the coated film and development in chloroform solvent, a halftone image would be obtained. This result would demonstrate the photo-oxidation imaging process with a soluble, rubbery amino-functional photopolymer.

EXAMPLE 13

Example 12 may be repeated, except that the dimethylaminoethyl methacrylate may be replaced by additional butyl acrylate (25 parts) in the polymer synthesis. After the 60-second exposure of the coated film and development in chloroform solvent, the film coating would dissolve and no image would be obtained. After a 600-second exposure, only a very faint image would be obtained. These results would demonstrate the requirement of the amino-functionality in the photo-oxidation imaging of a soluble, rubbery polymer film.

EXAMPLE 14

Example 12 may be repeated, except that the dimethylaminoethyl methacrylate may be replaced by vinylbenzyldimethylamine (60% meta, 40% para) in the polymer synthesis. After a 150-second exposure of the coated film and development in chloroform solvent, a halftone image would be obtained. This result would demonstrate the effectiveness of an alternate soluble, rubbery amino-functional photopolymer.

EXAMPLE 15

A casting solution consisting of a mixture of 50% of the casting dispersion from Example 6 and 50% of the casting solution from Example 12 was prepared and cast onto the film base as in Example 1. After a 45-second exposure of the dried film, as in Example 1, and development in chloroform solvent, a halftone image was obtained. This result demonstrates the effectiveness of an admixture of a small-particle-size microgel cross-linked amino-functional photopolymer and a soluble amino-functional photopolymer.

EXAMPLE 16

A microgel polymer containing amino dye-binding groups was prepared by free-radical emulsion polymerization of methyl methacrylate (25 parts), butyl acrylate (25 parts), dimethylaminoethyl methacrylate (50 parts), trimethylolpropane trimethacrylate (4.7 parts) and butyl thioglycolate (1.0 part). The latex was coagulated, and the isolated polymer was dried. A coating dispersion was prepared from 8 parts polymer, 92 parts toluene, 0.04 part tetraphenyl porphorin (TPP) and 4 parts of a cyan pigment grind made from 30 parts pigment (American Cyanamid Cyan Blue GT-55-3290), 170 parts toluene, 25 parts 20% SBR rubber solution in toluene (Goodyear 1503), 3 parts zinc stearate and 0.2 part Atlas G-3300. The dispersion was coated on polypropylene-coated polyester film using a #8 wire-wound rod. After drying, the film was exposed in a vacuum frame in contact with a standard halftone test negative for 60 seconds (Berkey-2Kw Addalux diazo source, 24 inches distant). Immersion in chloroform removed unexposed areas to yield a high-quality, half-tone image. Diffuse transmission optical density or absorbance values were: OD (filter)=0.04 (blue), 0.13 (green) and 0.55 (red). This result demonstrates the effectiveness of the copresence of amino-functionality, sulfur-functionality (derived from the butyl thioglycolate chain-transfer agent) and C=C unsaturation (derived from the SBR rubber in the pigment grind), as mentioned earlier (see pages 5 and 6). A dye solution was prepared from 1 part Pylam Acid yellow #36 (824761A) dissolved in 50 parts cellosolve and 50 parts water. The pH was adjusted to 3.0 by adding 0.1 N HCl solution. The imaged photopolymer film from above was dyed in this solution for 10 minutes, then washed with 50/50 cellosolve/water, then air-dried. The following OD values were obtained: OD (filter)=3.5 (blue), 0.50 (green) and 0.65 (red). The background OD was less than 0.1 (blue) relative to the film base.

The compositions of the present invention, when post-dye developed as described in Example 16 above, are especially useful for making many different kinds of high-absorbence (or high-OD) photographic or photosensitive photopolymer films having practical photographic speeds. The invention provides for addition of the high absorbance to the photosensitive film after imagewise exposure, precluding the problem of absorption of the light flux during imagewise exposure. One very important use of the invention could be in the production of high-absorbance, high-contrast graphic arts contact and duplicating films. Because the new compositions of matter encompass such a great variety of amino-functional polymers and singlet-oxygen photosensitizers, and because the new imaging process can be conducted in a variety of ways, the present invention should be useful for a number of important practical applications, such as graphic arts colorproofing films, lithographic plates, gravure-cylinder coatings and laser-sensitive films and plates.

What is claimed is:

1. An imaging process comprising selectively exposing to electromagnetic radiation in the presence of ordinary molecular oxygen a film or layer of a photopolymer composition comprising an amino-functional photopolymer having two or more amino-functional groups per polymeric unit, said amino-functional groups comprising one selected from the group consisting of tertiary aliphatic amines, hindered secondary aliphatic amines, dialkyl aryl amines and combinations thereof, and a photosensitizer capable of generating singlet molecular oxygen upon being subjected to electromagnetic radiation in the presence of ordinary molecular oxygen, said photopolymer being capable of undergoing a photooxidation reaction when exposed to electromagnetic radiation in the presence of said photosensitizer and ordinary molecular oxygen to form a latent image in the exposed regions of said film or layer.

2. The process of claim 1 further comprising developing said latent image.

3. The process of claim 1 wherein said photopolymer is a linear or branched soluble polymer.

4. The process of claim 1 wherein said photopolymer is a small-particle-size microgel cross-linked polymer.

5. The process of claim 1 wherein said photopolymer is an admixture of a linear or branched soluble polymer and a small-particle-size microgel cross-linked polymer.

6. The process of claim 1 wherein said photopolymer is a soluble branched or small-particle-size cross-linked copolymer of one or more monomers selected from the group consisting of:

styrene; α-methylstyrene; 2-methylstyrene; 4-methylstyrene; methyl methacrylate; ethyl methacrylate; propyl methacrylate; butyl methacrylate; 2-ethylhexyl methacrylate; cyclohexyl methacrylate; benzyl methacrylate; methyl acrylate; ethyl acrylate; propyl acrylate; butyl acrylate; cyclohexyl acrylate; 2-ethylhexyl acrylate; benzyl acrylate; isoprene; and/or 1,3-butadiene;

copolymerized with one or more monomers selected from the group consisting of:

ethylene glycol dimethacrylate; ethylene glycol diacrylate; propylene glycol dimethacrylate; propylene glycol diacrylate; tetramethylene glycol dimethacrylate; tetramethylene glycol diacrylate; diethylene glycol dimethacrylate; diethylene glycol diacrylate; dipropylene glycol dimethacrylate; dipropylene glycol diacrylate; ditetramethylene glycol dimethacrylate; ditetramethylene glycol diacrylate; poly(ethylene glycol dimethacrylate); poly(ethylene glycol diacrylate); poly(propylene glycol dimethacrylate); poly(propylene glycol diacrylate); poly(tetramethylene glycol dimethacrylate); poly(tetramethylene glycol diacrylate); trimethylolpropane dimethacrylate; trimethylolpropane diacrylate; trimethylolpropane trimethacrylate; trimethylolpropane triacrylate; pentaerythritol dimethacrylate; pentaerythritol diacrylate; pentaerythritol trimethacrylate; pentaerythritol triacrylate; pentaerythritol tetramethacrylate; pentaerythritol tetracrylate; bisphenol "A" dimethacrylate; bisphenol "A" diacrylate; divinylbenzene; bis(vinylphenyl) methane; bis(vinylphenyl) ethane; bis(vinylphenyl) propane; bis(vinylphenyl) butane; bis(vinylphenyl) ether; bis(vinylphenyl) sulfide; allyl methacrylate; allyl acrylate; crotyl methacrylate; crotyl acrylate; cinnamyl methacrylate; cinnamyl acrylate; cinnamoyloxyethyl methacrylate; cinnamoyloxyethyl acrylate; diallyl fumarate; allyl cinnamate; N-allylacrylamide; and/or N,N-diallyacrylamide; and further copolymerized with one or more monomers selected from the group consisting of:

dimethylaminoethyl methacrylate; dimethylaminoethyl acrylate; diethylaminoethyl methacrylate; diethylaminoethyl acrylate; vinylbenzyldimethylamine; vinylbenzyldiethylamine; N-dimethylaminoethyl acrylamide; N-diethylaminoethyl acrylamide; N,N-bis(dimethylaminoethyl) acrylamide; N,N-bis(diethylaminoethyl) acrylamide; N,N-dimethylisobutenylamine; N,N-diethylisobutenylamine; allyldimethylamine; and/or allyldiethylamine.

7. The process of claim 1 wherein said photopolymer is a soluble copolymer of one or more monomers selected from the group consisting of:

styrene; α-methylstyrene; 2-methylstyrene; 4-methylstyrene; methyl methacrylate; ethyl methacrylate; propyl methacrylate; butyl methacrylate; 2-ethylhexyl methacrylate; cyclohexyl methacrylate; benzyl methacrylate; ethyl acrylate; propyl acrylate; butyl acrylate; cyclohexyl acrylate; 2-ethylhexyl acrylate; benzyl acrylate; isoprene; and/or 1,3-butadiene;

copolymerized with one or more monomers selected from the group consisting of:

dimethylaminoethyl methacrylate; dimethylaminoethyl acrylate; diethylaminoethyl methacrylate; diethylaminoethyl acrylate; vinylbenzyldimethylamine; vinylbenzyldiethylamine; N-diethylaminoethyl acrylamide; N-dimethylaminoethyl acrylamide; N,N-bis(dimethylaminoethyl) acrylamide; N,N-bis(diethylaminoethyl) acrylamide; N,N-dimethylisobutenylamine; N,N-diethylisobutenylamine; allyldimethylamine; and/or allyldiethylamine.

8. The process of claim 1 wherein said photopolymer is an admixture of at least one of a soluble branched or small-particle-size cross-linked copolymer of one or more monomers selected from the group consisting of:

styrene; α-methylstyrene; 2-methylstyrene; 4-methylstyrene; methylmethacrylate; ethyl methacrylate; propyl methacrylate; butyl methacrylate; 2-ethylhexyl methacrylate; cyclohexyl methacrylate; benzyl methacrylate; methyl acrylate; ethyl acrylate; propyl acrylate; butyl acrylate; cyclohexyl acrylate; 2-ethylhexyl acrylate; benzyl acrylate; isoprene; and/or 1,3-butadiene;

copolymerized with one or more monomers selected from the group consisting of:

ethylene glycol dimethacrylate; ethylene glycol diacrylate; propylene glycol dimethacrylate; propylene glycol diacrylate; tetramethylene glycol dimethacrylate; tetramethylene glycol diacrylate; diethylene glycol dimethacrylate; diethylene glycol diacrylate; dipropylene glycol dimethacrylate; dipropylene glycol diacrylate; ditetramethylene glycol dimethacrylate; ditetramethylene glycol diacrylate; poly(ethylene glycol dimethacrylate); poly(ethylene glycol diacrylate); poly(propylene glycol dimethacrylate); poly(propylene glycol diacrylate); poly(tetramethylene glycol dimethacrylate); poly(tetramethylene glycol diacrylate); trimethylolpropane dimethacrylate; trimethylolpropane diacrylate; trimethylolpropane trimethacrylate; trimethylolpropane triacrylate; pentaerythritol dimethacrylate; pentaerythritol diacrylate; pentaerythritol trimethacrylate; pentaerythritol triacrylate; pentaerythritol tetramethacrylate; pentaerythritol tetracrylate; bisphenol "A" dimethacrylate; bisphenol "A" diacrylate; divinylbenzene; bis(vinylphenyl) methane; bis(vinylphenyl) ethane; bis(vinylphenyl) propane; bis(vinylphenyl) butane; bis(vinylphenyl) ether; bis(vinylphenyl) sulfide; allyl methacrylate; allyl acrylate; crotyl methacrylate; crotyl acrylate; cinnamyl methacrylate; cinnamyl acrylate; cinnamoyloxyethyl methacrylate; cinnamoyloxyethyl acrylate; diallyl fumarate; allyl cinnamate; N-allylacrylamide; and/or N,N-diallyacrylamide; and further copolymerized with one or more monomers selected from the group consisting of:

dimethylaminoethyl methacrylate; dimethylaminoethyl acrylate; diethylaminoethyl metacrylate; diethylaminoethyl acrylate; vinylbenzyldimethylamine; vinylbenzyldiethylamine; N-dimethylaminoethyl acrylamide; N-diethylaminoethyl acrylamide; N,N-bis(dimethylaminoethyl) acrylamide; N,N-bis(diethylaminoethyl) acrylamide; N,N-dimethylisobutenylamine; N,N-diethylisobutenylamine; allyldimethylamine; and/or allyldiethylamine;

and at least one soluble copolymer of one or more monomers selected from the group consisting of:

styrene; α-methylstyrene; 2-methylstyrene; 4-methylstyrene; methyl methacrylate; ethyl methacrylate; propyl methacrylate; butyl methacrylate; 2- ethylhexyl methacrylate; cyclohexyl methacrylate; benzyl methacrylate; ethyl acrylate; propyl acrylate; butyl acrylate; cyclohexyl acrylate; 2-ethylhexyl acrylate; benzyl acrylate; isoprene; and/or 1,3-butadiene;

copolymerized with one or more monomers selected from the group consisting of:

dimethylaminoethyl methacrylate; dimethylaminoethyl acrylate; diethylaminoethyl methacrylate; diethylaminoethyl acrylate; vinylbenzyldimethylamine; vinylbenzyldiethylamine; N-diethylaminoethyl acrylamide; N-dimethylaminoethyl acrylamide; N,N-bis(dimethylaminoethyl) acrylamide; N,N-bis(diethylaminoethyl) acrylamide; N,N-dimethylisobutenylamine; N,N-diethylisobutenylamine; allyldimethylamine; and/or allyldiethylamine.

9. The process of claim 1 wherein said photopolymer contains amino dye-binding groups.

10. The process of claim 1 wherein said photosensitizer is a porphorin-type compound.

11. The process of claim 1 wherein said photosensitizer is tetraphenylporphorin.

12. The process of claim 1 wherein said photosensitizer is fluoranthane.

13. The process of claim 1 wherein said photosensitizer is dinaphthalene thiophene.

14. The process of claim 2 wherein said developing is carried out by removal of the unexposed region of said film or layer by contact with a fluid solvent or redispersing medium.

15. The process of claim 2 wherein said developing is carried out by removal of the unexposed region of said film or layer by contact with and transfer to another surface.

16. The process of claim 14 wherein said developing is carried out further by post-dyeing of the resultant image.

17. The process of claim 15 wherein said developing is carried out further by post-dyeing of either or both resultant images.

18. The process of claim 2 wherein said developing is carried out by dusting said layer or film with pigment or toner, resulting in retention of said pigment or toner by the unexposed regions of said layer or film.

19. The process of claim 15 wherein said developing is carried out further by dusting said transferred image with pigment or toner.

* * * * *